(12) United States Patent
Kojima (10) Patent No.: US 10,488,914 B2
(45) Date of Patent: Nov. 26, 2019

(54) WIRING WITH EXTERNAL TERMINAL (71) Applicant: MICRON TECHNOLOGY, INC., Boise, ID (US)

(72) Inventor: Mieko Kojima, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/105,599

(22) Filed: Aug. 20, 2018

(65) Prior Publication Data

US 2018/0364797 A1  Dec. 20, 2018

Related U.S. Application Data

(63) Continuation of application No. 15/628,543, filed on Jun. 20, 2017.

(51) Int. Cl.
| | |
|---|---|
| H03K 19/0185 | (2006.01) |
| G06F 3/00 | (2006.01) |
| H03K 19/096 | (2006.01) |
| H04L 25/03 | (2006.01) |
| H03K 19/0175 | (2006.01) |
| H04L 25/02 | (2006.01) |
| H03K 19/003 | (2006.01) |

(52) U.S. Cl.
CPC ....... *G06F 3/002* (2013.01); *H03K 19/00361* (2013.01); *H03K 19/0175* (2013.01); *H03K 19/096* (2013.01); *H04L 25/0272* (2013.01); *H04L 25/03* (2013.01)

(58) Field of Classification Search
CPC .............. G06F 3/002; H03K 19/00361; H03K 19/0175; H03K 19/096; H04L 25/0272; H04L 25/03
See application file for complete search history.

(56) References Cited

U.S. PATENT DOCUMENTS

| | | | | |
|---|---|---|---|---|
| 5,986,489 | A * | 11/1999 | Raza | H03K 19/00361 326/82 |
| 6,114,903 | A * | 9/2000 | Bach | H01L 27/118 257/357 |
| 6,313,672 | B1 * | 11/2001 | Ajit | H03K 19/00315 326/27 |
| 7,626,423 | B1 * | 12/2009 | Li | H03K 19/018585 326/27 |

(Continued)

OTHER PUBLICATIONS

U.S. Appl. No. 15/628,543, entitled: "Wiring With External Terminal" filed Jun. 20, 2017; pp. all.

*Primary Examiner* — Alexander H Taningco
*Assistant Examiner* — Kurtis R Bahr
(74) *Attorney, Agent, or Firm* — Dorsey & Whitney LLP (57) ABSTRACT

Apparatuses in data input/output circuits of a semiconductor device are described. An example apparatus includes an output driver and a pre-output driver. The pre-output driver includes: an output terminal coupled to the output driver and provides an output signal to the output driver; an output stage that receives a data signal and provides the output signal to the output terminal responsive, at least in part, to the data signal; and a slew rate control stage coupled to the output stage and controls a current flowing through the output stage. The output stage is disposed between the slew rate control stage and the output terminal.

20 Claims, 11 Drawing Sheets

(56) References Cited

U.S. PATENT DOCUMENTS

| | | | |
|---|---|---|---|
| 8,144,726 B2 * | 3/2012 | Xu | G06F 13/4295 |
| | | | 370/236 |
| 8,466,718 B2 * | 6/2013 | Ezumi | H03K 19/018528 |
| | | | 327/108 |
| 10,020,252 B2 | 7/2018 | Miura et al. | |
| 10,156,893 B1 | 12/2018 | Kojima | |
| 2007/0013411 A1 * | 1/2007 | Asaduzzaman | H03K 17/164 |
| | | | 326/83 |
| 2008/0180175 A1 * | 7/2008 | Arai | H03F 1/301 |
| | | | 330/277 |
| 2015/0155875 A1 * | 6/2015 | Wada | H03K 19/018514 |
| | | | 327/108 |
| 2016/0003887 A1 | 1/2016 | Nagase | |
| 2018/0364796 A1 | 12/2018 | Kojima | |

\* cited by examiner

WIRING WITH EXTERNAL TERMINAL

CROSS-REFERENCE TO RELATED APPLICATION

This application is a continuation of U.S. patent application Ser. No. 15/628,543, filed Jun. 20, 2017 and issued as U.S. Pat. No. 10,156,893 on Dec. 18, 2018. The aforementioned application, and issued patent, is incorporated by reference herein, in its entirety, and for all purposes.

BACKGROUND

High data reliability, high speed of memory access, reduced chip size and reduced power consumption are features that are demanded from semiconductor memory.

In conventional peripheral circuitries for a semiconductor device, for example, pads and data queue circuits (or data input/output circuits) are arranged in a corresponding manner across layers. The data queue circuit or data input/output circuit is called collectively "DQ circuit" hereinafter. Each pad, which is configured to be coupled to an external circuitry outside the semiconductor device, is located in proximity to (e.g., immediately above) its respective DQ circuit in order to keep wirings between the pads and the DQ circuits the same length that is sufficiently short to have the same low impedance. In recent years, there has been an effort to reduce an area of a peripheral circuit region that is occupied by peripheral circuitries included on a semiconductor die of a memory device. For example, a size of each DQ circuit has become even smaller in order to improve driving ability for faster operations by shorter wirings (e.g., a clock signal line CLK, which provides a clock signal to the DQ circuits).

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

As previously described, a size of each DQ circuit has become even smaller; however, reducing a size of each pad is still challenging. Due to the size difference between pads and DQ circuits, wirings between the DQ circuits as well as between the DQ circuits and the pads are longer. The longer wirings tend to result in higher power consumption due to each wiring's inherent impedance according to its length.

Figure 1:
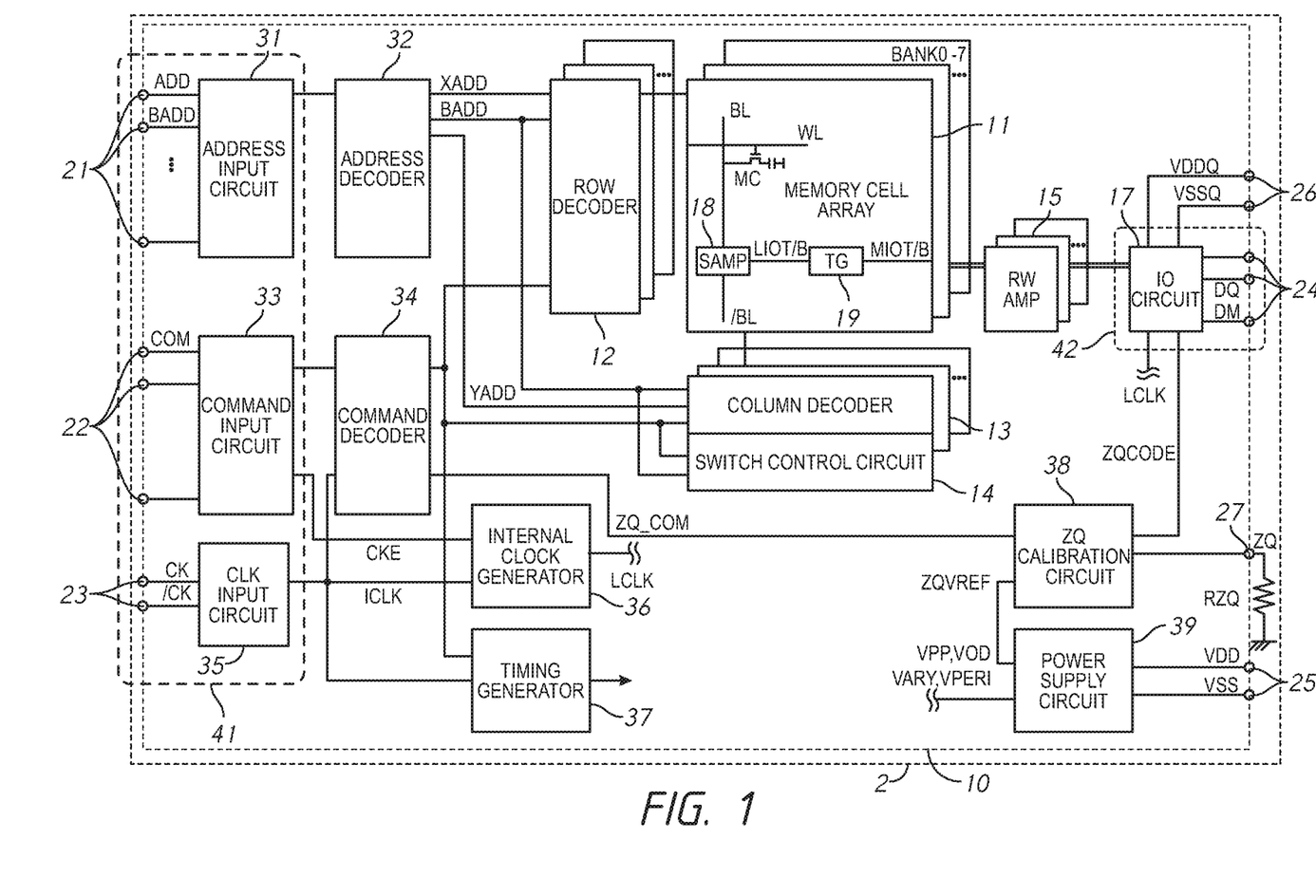
FIG. 1 is a block diagram of a semiconductor device in accordance with an embodiment of the present disclosure.

FIG. 1 is a block diagram of a semiconductor device 10 in accordance with one embodiment of the present disclosure. The semiconductor device 10 may be an SDRAM integrated into a single semiconductor chip, for example. The semiconductor device 10 may be mounted on an external substrate 2 that is a memory module substrate, a mother board or the like. The external substrate 2 employs an external resistor $R_{ZQ}$ that is connected to a calibration terminal ZQ 27 of the semiconductor device 10. The external resistor $R_{ZQ}$ is a reference impedance of a ZQ calibration circuit 38. In the present embodiment, the external resistor $R_{ZQ}$ is coupled to a ground potential.

As shown in FIG. 1, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, data terminals 24, power supply terminals 25 and 26, and the calibration terminal ZQ 27. An input signal block 41 may include the address terminals 21, the command terminals 22 and the clock terminals 23, which may be coupled to input buffers. A data interface block 42 includes the data terminals 24. The data terminals 24 may be coupled to output buffers for read operations of memories. Alternatively, the data terminals 24 may be coupled to input buffers for read/write access of the memories. FIG. 1 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12, the column decoder 13, and a switch control circuit 14.

The command terminals 22 are supplied with a command signal COM. The command signal COM may include one or more separate signals. The command signal COM input to the command terminals 21 is input to a command decoder 34 via a command input circuit 33. The command decoder 34 decodes the command signal COM to generate various internal command signals. For example, the internal commands may include a row command signal to select a word line and a column command signal, such as a read command or a write command, to select a bit line, and a calibration signal ZQCODE provided to the ZQ calibration circuit 38.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output circuit 17. Similarly, when the write command is issued and a row address and a column address are timely supplied with this command, and then write data DQ is supplied to the data terminals 24, the write data DQ is supplied via the input/output circuit 17 and the read/write amplifier 15 to the memory cell array 11 and written in the memory cell MC designated by the row address and the column address.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

The power supply terminals 25 are supplied with power supply potentials VDD and VSS. These power supply potentials VDD and VSS are supplied to an internal power supply circuit 39. The internal power supply circuit 39 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in the sense amplifiers 18 included in the memory cell array 11, and the internal potential VPERI is used in many other circuit blocks. The reference potential ZQVREF is used in the ZQ calibration circuit 38.

The power supply terminals 26 are supplied with power supply potentials VDDQ and VSSQ. These power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the power supply potentials VDDQ and VSSQ may be used for the input/output circuit 17 so that power supply noise generated by the input/output circuit 17 does not propagate to the other circuit blocks.

The calibration terminal ZQ is connected to the calibration circuit 38. The calibration circuit 38 performs a calibration operation with reference to an impedance of an external resistance Re and the reference potential ZQVREF, when activated by the calibration signal ZQ_COM. An impedance code ZQCODE obtained by the calibration operation is supplied to the input/output circuit 17, and thus an impedance of an output buffer (not shown) included in the input/output circuit 17 is specified.

Figure 2A:
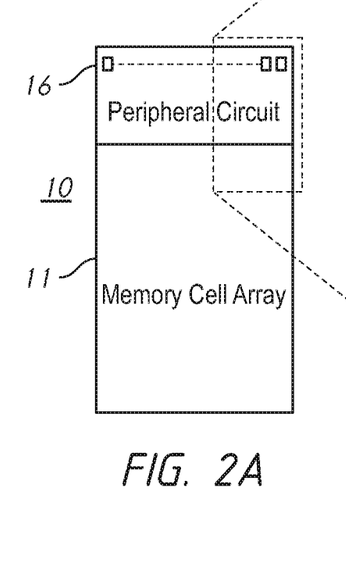
FIG. 2A is a layout diagram of the semiconductor device in accordance with an embodiment of the present disclosure.

FIG. 2A is a layout diagram of the semiconductor device 10 in accordance with one embodiment of the present disclosure. The semiconductor device 10 may include an area including the memory cell array 11 and a peripheral circuit area 16, which may include circuits included in the semiconductor device 10 related to input/output interface. For example, the circuits disposed in the peripheral circuit area 16 may include address related circuits (e.g., the address input circuit 31, the address decoder 32, the row decoder 12, the column decoder 13), command control related circuits (e.g., the command input circuit 33, the command decoder 34), clock related circuits (the clock input circuit 41, the internal clock generator 36, the timing generator 37), input/output related circuits (the read/write amplifier 15, the input/output circuit 17) etc. as described above with FIG. 1.

Figure 2B:
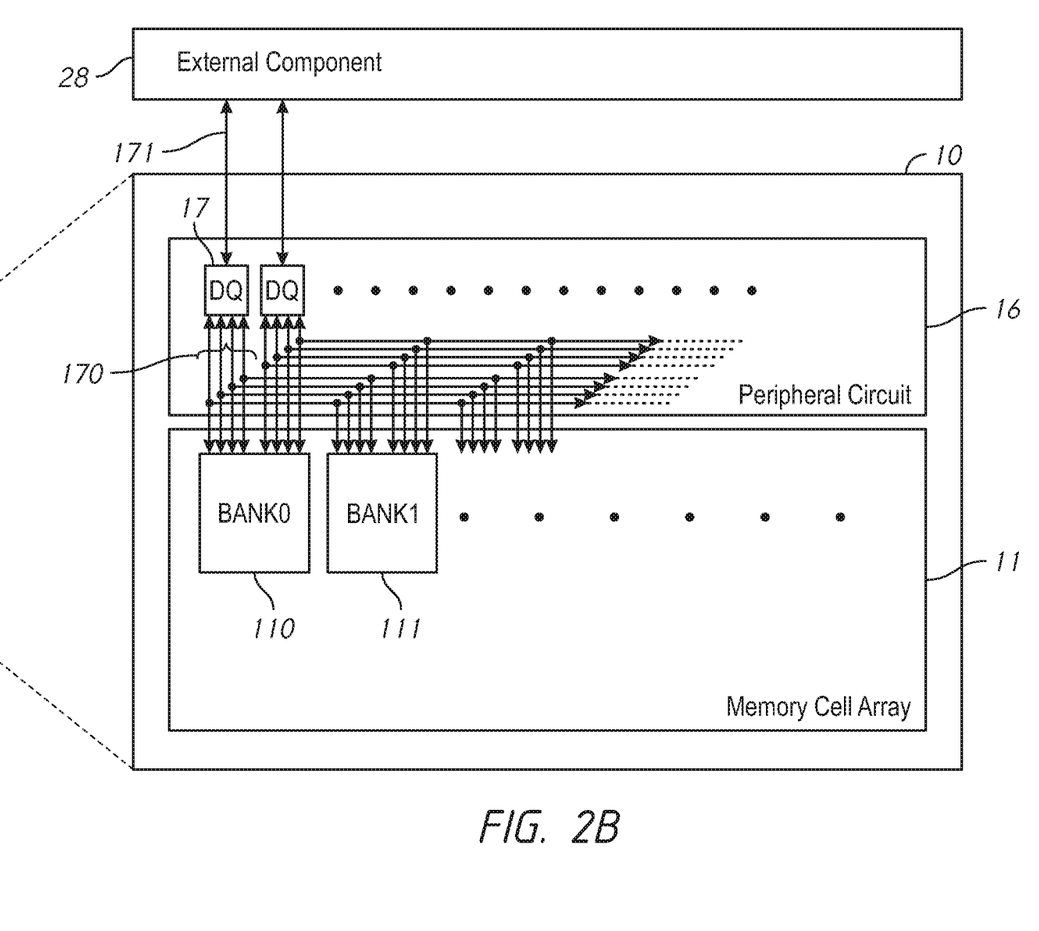
FIG. 2B is a layout diagram of the semiconductor device in accordance with an embodiment of the present disclosure.

FIG. 2B is a layout diagram of the semiconductor device 10 in accordance with one embodiment of the present disclosure. For example, the semiconductor device 10 of FIG. 2B may include a portion of the memory cell array 11 and a portion of the peripheral circuit area 16. The portion of the peripheral circuit area may communicate with an external component 28. The memory cell array 11 may include a plurality of banks (e.g., Bank0 110, Bank1 111, etc.). The peripheral circuit 16 may include a plurality of input/output (DQ) circuits 17. A plurality of internal paths 170 may transmit read data and write data in parallel between each bank of the plurality of banks and the plurality of input/output circuits 18. Each input/output circuit of the plurality of input/output circuits 17 may receive the read data in parallel from a bank among the plurality of banks via the plurality of internal paths 170 and provide the read data in a serial manner to the external component 28 via an external path 171 coupling each input/output circuit 17 to the external component 28. Each input/output circuit of the plurality of input/output circuits 17 may receive the write data in a serial manner parallel from the external component 28 and provide the write data in parallel to the bank among the plurality of banks via the external path 170. For example, the parallel data may be transmitted via the internal path 171 at low speed and the serial data may be transmitted via the external path the 170 at high speed.

Figure 3:
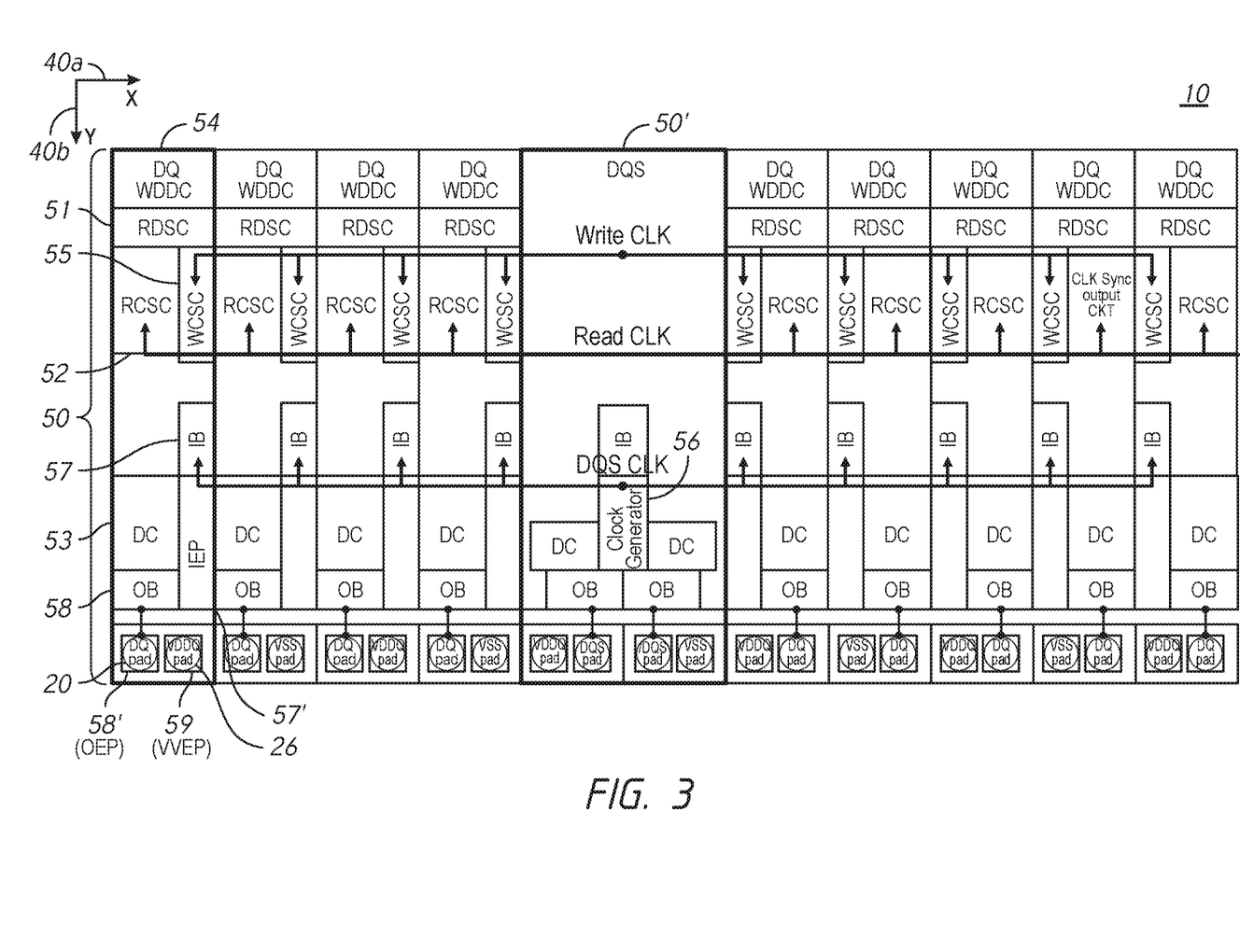
FIG. 3 is a layout diagram including a DQ circuit and the DQ pad in the semiconductor device in accordance with an embodiment of the present disclosure.

FIG. 3 is a layout diagram including a DQ circuit 50 and the DQ pad 20 in the semiconductor device 10 in accordance with an embodiment of the present disclosure. For example, FIG. 3 may be a plan view of a layout of a plurality of DQ circuits and a data strobe (DQS) circuit 50' disposed in a first direction 40*a*, in the semiconductor device 10, from a third direction (not shown) that is perpendicular to the first direction and a second direction, 40*a* and 40*b*. The layout includes the DQ circuit 50 of the plurality of DQ circuits, which may include the DQ terminal (DQ pad) 20 and the VDDQ terminal (VDDQ pad) 26 or VSS terminal (VSS pad). The layout may further include the DQS circuit 50' which may include true-DQS terminal (DQS pad), complementary DQS terminal (/DQS pad), VDDQ terminal/pad and VSS terminal/pad. For example, the plurality of DQ circuits 50 and the DQS circuit 50' may be disposed in the peripheral circuit 16 of FIGS. 2A and 2B. For example, the DQ circuit 50 may be the input/output circuit 17 in FIGS. 1 and 2B.

For example, the DQ circuit 50 may include a write data driver circuit (WDDC) 54 and a read data storage circuit (RDSC) 51 coupled to a memory cell array (e.g., the memory cell array 11) and disposed on a side of the memory cell array and away from the DQ pad 20. For example, the read clock synchronization circuit (RCSC) 52 may be disposed next to the read data storage circuit (RDSC) 51 located in the second direction 40*b*. For example, the read clock synchronization circuit (RCSC) 52 may receive a read clock signal (Read CLK) generated by a clock generator 56 in the DQS circuit 50'. A driver circuit (DC) 53 may be disposed closer to the DQ pad 20 sandwiching an output buffer (OB, e.g., an output driver) 58 in the second direction 40*b*. The output buffer (OB) 58 may be disposed between the driver circuit (DC) 63 in the first direction 57*a* and an output ESD protection circuit (OEP) 58' surrounding the DQ pad 20. Thus, circuit components of a read data path (e.g., a read data path 60*a* that will be described later with reference to FIG. 4), including the read data storage circuit (RDSC) 51, the read clock synchronization circuit (RCSC) 52, the driver circuit (DC) 53, the output buffer (OB) 58 and the output ESD protection circuit (OEP) 58', may be disposed in the second direction 40*b* in the DQ circuit 50 as viewed from the third direction.

For example, the write clock synchronization circuit (WCSC) 55 that may receive a write clock signal (Write CLK) generated by the clock generator 56 from the DQS circuit 50' may be disposed next to the read clock synchronization circuit (RCSC) 52 located in the first direction 40*a*. The input buffer (IB) 57 may be disposed between the write clock synchronization circuit (WCSC) 55 and an input ESD protection circuit (IEP) 57' in the second direction 40*b*. A VDDQ/VSS ESD protection circuit (VVEP) 59 may be located in the second direction 40*b* of the input ESD protection circuit (IEP) 57' and the first direction 40*a* of the output ESD protection circuit (OEP) 58'. The VDDQ/VSS ESD protection circuit (VVEP) 59 may protect a voltage signal from the VDDQ pad 26 (or VSS pad in case of a DQ circuit next to the DQ circuit 54), having power supply potential, either VDDQ (or VSS for the VSS pad), from failures due to electrostatic charges. For example, the DQ pad 20 may be located in the first direction 40*a* from the VDDQ pad 26. Thus, circuit components of a write data path (e.g., a write data path 60*b* that will be described later with reference to FIG. 4), including the write data driver circuit (WDDC) 64, the write clock synchronization circuit (WCSC) 65, the input buffer (IB) 67 and the input ESD protection circuit (IEP) 67', may be disposed in the second direction 40*b* in the DQ circuit 50 as viewed from the third direction.

Figure 4:
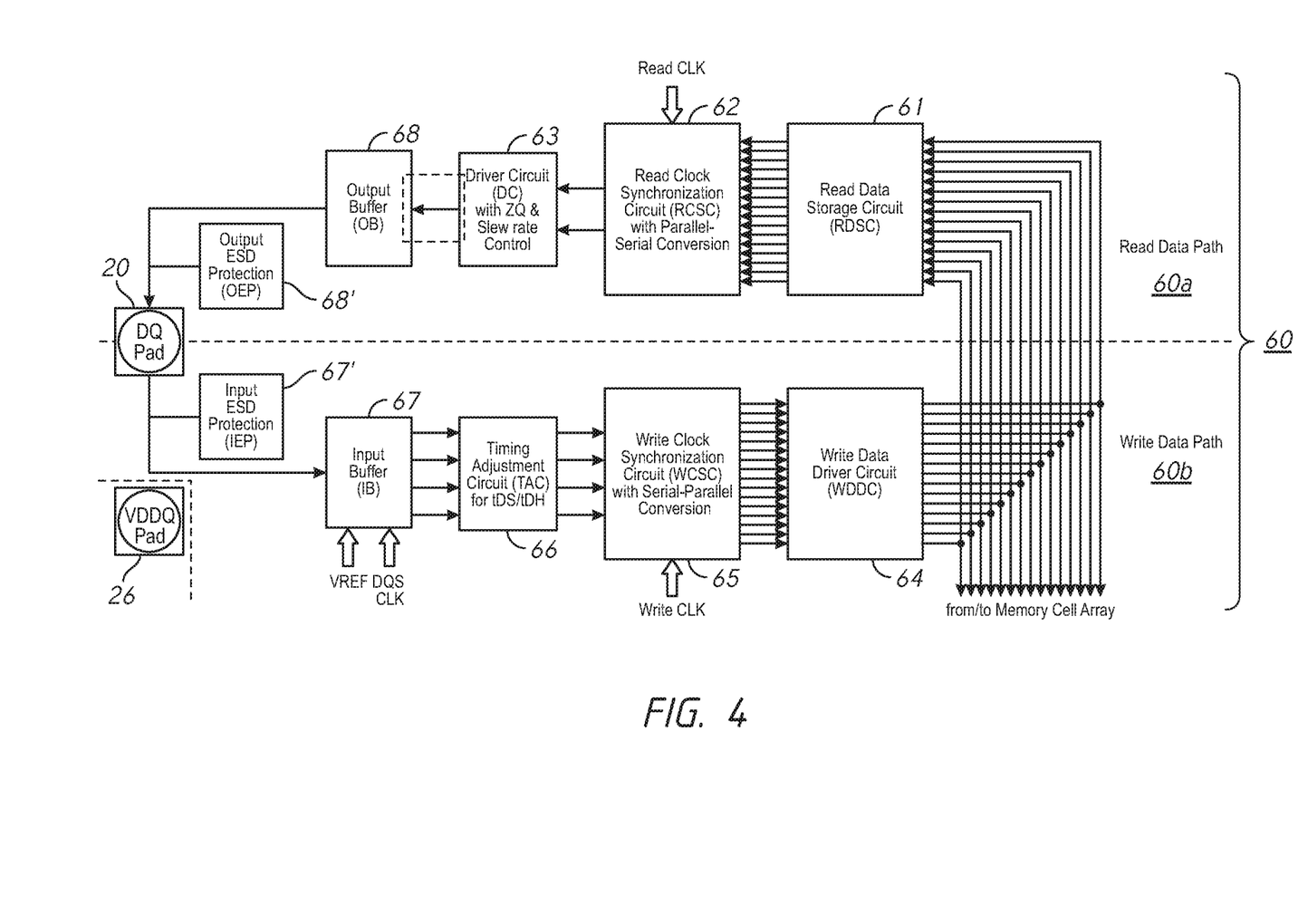
FIG. 4 is a block diagram of a DQ circuit 60 in the semiconductor device 10 in accordance with an embodiment of the present disclosure.

FIG. 4 is a block diagram of a DQ circuit 60 in the semiconductor device 10 in accordance with the present disclosure. For example, the DQ circuit 60 may be the DQ circuit 50 in FIG. 3. The DQ circuit 60 may execute read operations of data from a plurality of memory cells in the memory cell array area (e.g., the memory cell array 11) to the DQ pad 20 via a read data path 60*a*. The DQ circuit 60 may execute write operations of data from the DQ pad 20 to a plurality of memory cells in the memory cell array area via a write data path 60*b*. The VDDQ pad 26 may be located next to the DQ pad 20 for receiving a power voltage from outside of the DQ circuit 60.

For example, the read data path 60*a* may include a read data storage circuit (RDSC) 61 (e.g., RDSC 51 in FIG. 3), a read clock synchronization circuit (RCSC) 62 (e.g., RCSC 52 in FIG. 3), a driver circuit (DC) 63 (e.g., DC 53 in FIG. 3), an output buffer (OB) 68 (e.g., OB 58 in FIG. 3) and an output ESD (electrostatic discharge) protection circuit (OEP) 68' (e.g., OEP 58' in FIG. 3). A read data storage circuit (RDSC) 61 may receive data read from a plurality of memory cells in the memory cell array area and store the data. For example, the read clock synchronization circuit (RCSC) 62 may receive a clock signal for reading operations (Read CLK) and the data from the read data storage circuit (RDSC) 61. The read clock synchronization circuit (RCSC) 62 may convert the data in a plurality of bits in parallel into the data in time sequence (in a serial format), and provide the data in time sequence using the Read CLK signal. The driver circuit (DC) 63 may control activation and deactivation responsive to the calibration signal ZQ (e.g., via the calibration terminal ZQ 27 in FIG. 2) and further adjust a slew rate of the output buffer (OB) 68, based on, at least in part, a slew rate control signal. The output buffer (OB) 68 may provide the data in serial format to the DQ pad 20. The output ESD protection circuit (OEP) 68' may protect the data transmitted from the output buffer (OB) 68 to the DQ pad from failures due to electrostatic charges.

For example, the write data path 60*b* may include a write data driver circuit (WDDC) 64 (e.g., WDDC 54 in FIG. 3), a write clock synchronization circuit (WCSC) 62 (e.g., WCSC 52 in FIG. 3), a timing adjustment circuit (TAC) 66, an input buffer (IB) 67 (e.g., IB 57 in FIG. 3) and an input ESD protection circuit (IEP) 67' (e.g., IEP 57' in FIG. 3). The input ESD protection circuit (IEP) 67' may protect data transmitted from the DQ pad 20 to the input buffer (IB) 67 from failures due to electrostatic charges. The input buffer (IB) 67 may receive the data from the DQ pad 20, a reference voltage REF and a data strobe clock signal (DQS CLK). Responsive to the data strobe clock signal (DQS CLK), the input buffer (IB) 67 may latches the data from the DQ pad 20 using a reference voltage (VREF) to determine a value of the data (e.g., a logic high level or a logic low level). The time adjustment circuit (TAC) 66 may adjust a timing to provide the data from the input buffer (IB) 67 to a later stage of the write data path 60*b*, in view of a data setup time tDS and a data hold time tDH. For example, the data setup time tDS may describe a setup time of an input data pin for both rising and falling edges of the data strobe signal DQS. The data hold time tDH may describe a hold time of an input data pin for both rising and falling edges of the data strobe signal DQS. For example, the write clock synchronization circuit (WCSC) 65 may receive a clock signal for writing operations (Write CLK) and the data from the time adjustment circuit (TAC) 66. The write clock synchronization circuit (WCSC) 65 may convert the data in the serial format into the data in a plurality of bits in parallel, and provide the data in the plurality of bits in parallel to the write data driver circuit (WDDC) 64 responsive to the Write CLK signal. The write data driver circuit (WDDC) 64 may include a plurality of driver that may provide the data in parallel to the memory cells in the memory cell array area.

Figure 5A:
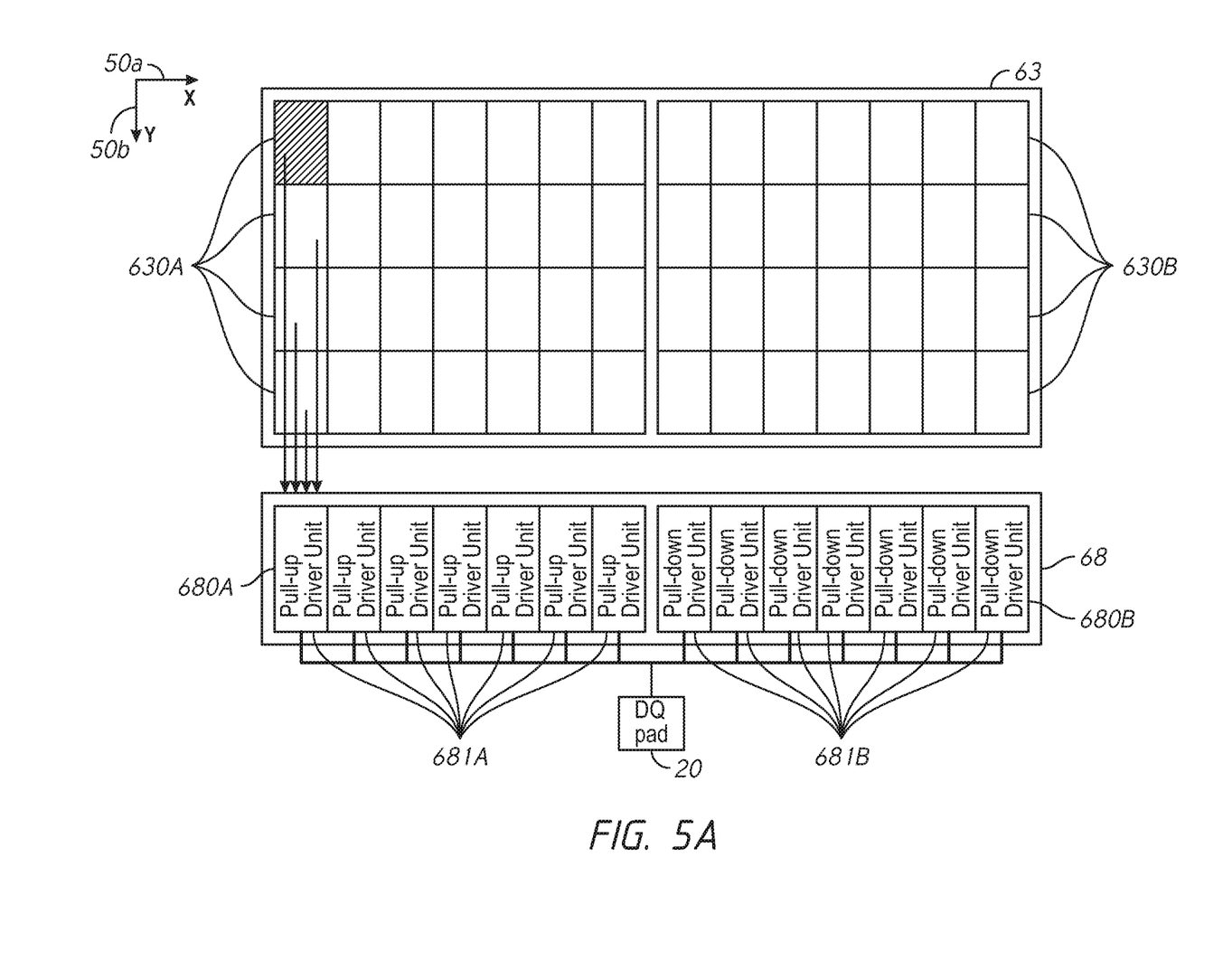
FIG. 5A is a schematic diagram of a portion of the driver circuit and a portion of the output buffer in the DQ circuit of FIG. 4 in accordance with an embodiment of the present disclosure.

FIG. 5A is a schematic diagram of a portion of the driver circuit 63 and a portion of the output buffer 68 in the DQ circuit 60 of FIG. 4 in accordance with an embodiment of the present disclosure. For example, the driver circuit 63 may include a plurality of pre-output driver circuits 630A and 630B. The plurality of pre-output driver circuits 630A may be coupled to a plurality of pull-up driver units 681A disposed in a first direction 50a perpendicular to a second direction 50b in a pull-up driver circuit 680A in the output buffer 68. For example, four pre-output driver circuits 630A disposed in the second direction 50b may be coupled to a pull-up driver unit 681A in the pull-up driver circuit 680A. The plurality of pre-output driver circuits 630B may be coupled to a plurality of pull-down driver units 681B disposed in the first direction 50a perpendicular to the first direction 50a in a pull-down driver circuit 680B in the output buffer 68. For example, four pre-output driver circuits 630B disposed in the second direction 50b may be coupled to a pull-down driver unit 681B in the pull-down driver circuit 680A.

Figure 5B:
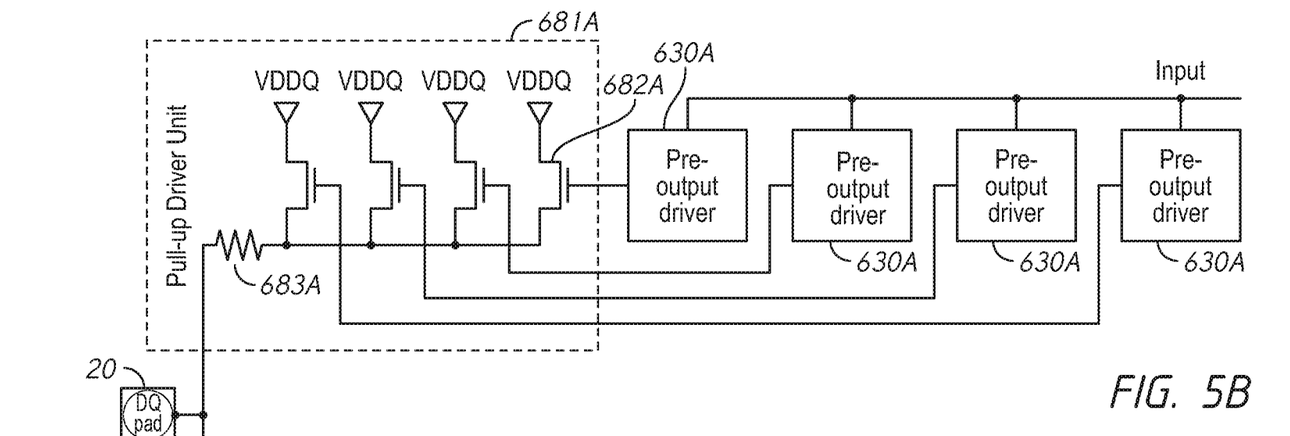
FIG. 5B is a block diagram of a plurality of pre-output driver circuits and a pull-up driver unit of FIG. 5A in accordance with an embodiment of the present disclosure.

FIG. 5B is a block diagram of a plurality of pre-output driver circuits 630A and a pull-up driver unit 681A of FIG. 5A in accordance with an embodiment of the present disclosure. A data signal (Input) may be provided to a plurality of input terminals of the plurality of the pre-output driver circuits 630A. For example, FIG. 5B may include four pre-output driver circuits 630A. The pull-up driver unit 681A may include a plurality of first channel type output transistors 682A corresponding to the plurality of pre-output driver circuits 630A. The plurality of first channel type output transistors 682A may have respective source nodes coupled to one end of a resister 683A having the other end that is coupled to a DQ pad 20. Each first channel type output transistor 682A may have a gate node coupled to an output node of a corresponding pre-output driver circuit 630A among the plurality of pre-output driver circuits 630A and a drain node coupled to a power voltage supply VDDQ. For example, the first channel type may be N-channel.

Figure 5C:
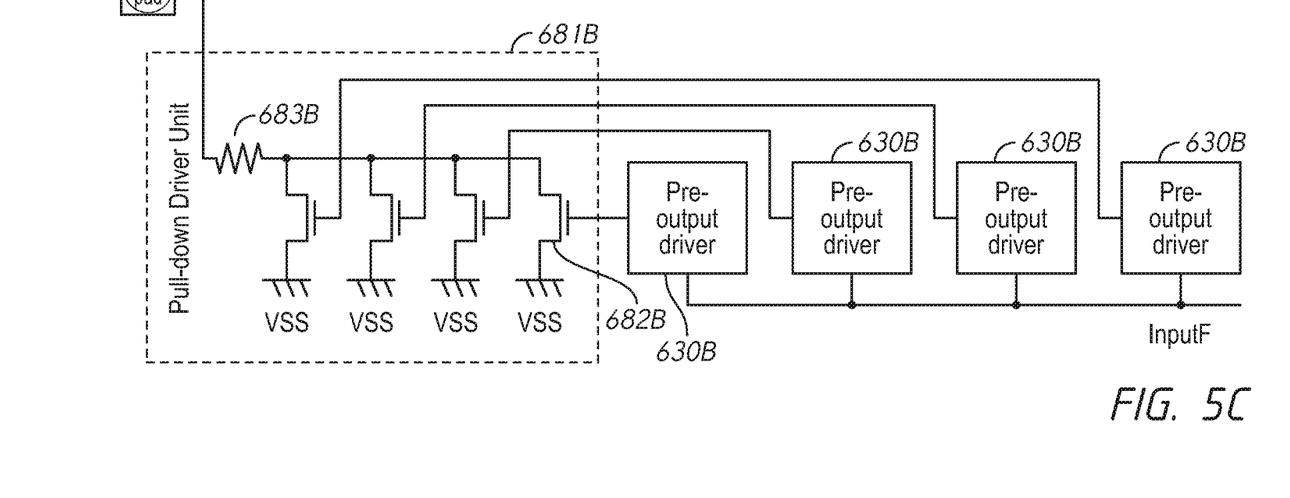
FIG. 5C is a block diagram of a plurality of pre-output driver circuits and a pull-down driver unit of FIG. 5A in accordance with an embodiment of the present disclosure.

FIG. 5C is a block diagram of a plurality of pre-output driver circuits 630B and a pull-down driver unit 681B of FIG. 5A in accordance with an embodiment of the present disclosure. A data signal (InputF) that may be an inverted signal of the data signal (Input) may be provided to a plurality of input terminals of the plurality of the pre-output driver circuits 630B. For example, FIG. 5C may include four pre-output driver circuits 630B. The pull-up driver unit 681B may include a plurality of first channel type output transistors 682B corresponding to the plurality of pre-output driver circuits 630B. The plurality of first channel type output transistors 682B may have respective source nodes coupled to one end of a resister 683B having the other end that is coupled to a DQ pad 20. Each first channel type output transistor 682B may have a gate node coupled to an output node of a corresponding pre-output driver circuit 630B among the plurality of pre-output driver circuits 630B and a drain node coupled to a power voltage supply VSS. For example, the first channel type may be N-channel.

Figure 6A:
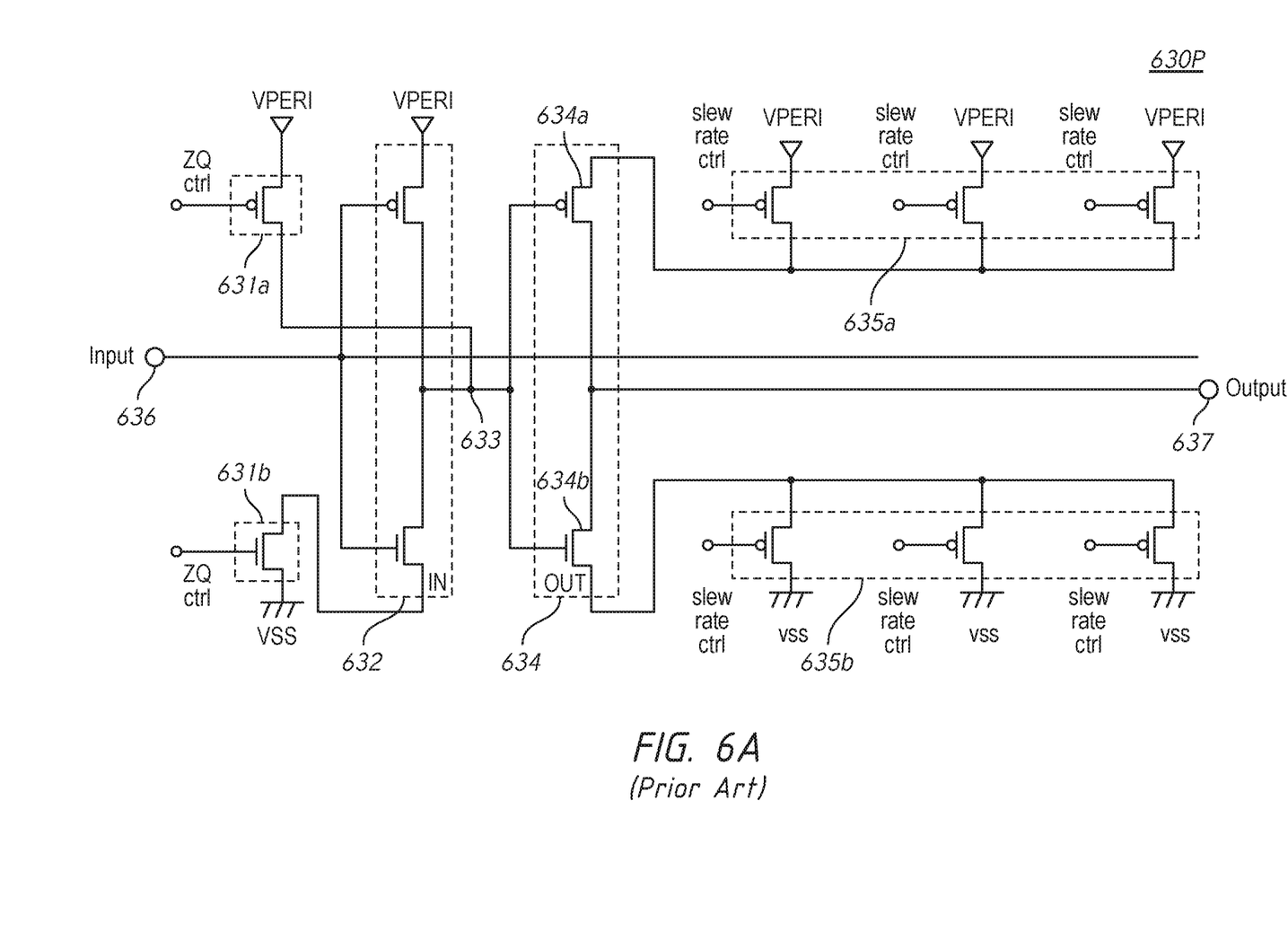
FIG. 6A is a circuit diagram of a pre-output driver circuit in a conventional DQ circuit.

FIG. 6A is a circuit diagram of a pre-output driver 630P in a conventional DQ circuit. For example, the pre-output driver 630P may include a plurality of transistor circuits, in order to represent a desired output impedance based on ZQ calibration and a desired slew rate based on slew rate calibration, as adjusted by the driver circuit (DC) 63.

For example, each pre-output driver 630P may include a second channel type transistor 631a and a first channel type transistor 631b that may receive a ZQ control signal ZQ ctrl for activation and deactivation of ZQ calibration operation control of a corresponding bit of ZQ code to adjust impedance of each pull-up or pull-down driver unit of the corresponding bit. For example, the ZQ control signal ZQ ctrl in an active state (e.g., a logic high "1" level) may activate the transistor 631b that may be the first channel type transistor that may couple an input inverter IN 632 to a power supply voltage VSS node. The input inverter IN 632 may be coupled to a peripheral power supply voltage VPERI node and the VSS node. The input inverter IN 632 may receive an input data signal Input at an input terminal 636 and provide an inverted input data signal to an output inverter OUT 634. Thus, the pre-output driver circuit 630P and the pull-up or pull-down driver unit coupled to the pre-output driver circuit 630P may be activated. On the other hand, the ZQ control signal ZQ ctrl in an inactive state (e.g., a logic low "0" level) may activate the second channel type transistor 631a that may couple a node 633 to a peripheral power supply voltage VPERI node, and the pre-output driver circuit 630P and the pull-up or pull-down driver unit coupled to the pre-output driver circuit 630P may be deactivated. For example, the second channel type may be P-channel.

The pre-output driver 630P may include a plurality of first slew rate control transistors 635a and a plurality of second slew rate control transistors 635b. For example, the output inverter OUT 634 may be coupled between the plurality of first slew rate control transistors 635a and the plurality of second slew rate control transistors 635b and may receive the inverted input signal from the node 633 and provide an output signal on an output terminal 637. The output inverter OUT 634 may include a second channel type transistor 634a and a first channel type transistor 634b. The second channel type transistor 634a may have a source node coupled to the first slew rate control transistors 635a, a drain node coupled to the output terminal 637 and a gate node configured to receive the inverted input signal from the node 633. The first channel type transistor 634b may have a source node coupled to the plurality of second slew rate control transistors 635b, a drain node coupled to the output terminal 637 and a gate node configured to receive the inverter input signal from the node 633. The plurality of the first slew rate control transistors 635a may be coupled between a peripheral power supply voltage VPERI node and the source node of the second channel type transistor 634a in parallel. The plurality of the second slew rate control transistors 635b may be coupled between a power supply voltage VSS node and the source node of the first channel type transistor 634b in parallel. The first slew rate control transistors 635a and the second slew rate control transistors 635b may receive slew-rate control signals (slew rate ctrl) to adjust or control a current and/or a voltage on the output terminal 637, resulting in adjusting or controlling a slew rate of an output buffer (e.g., the output buffer 68 in FIG. 5A) through a corresponding output driver unit (e.g., 681A or 682B in FIGS. 5B and 5C).

Figure 6B:
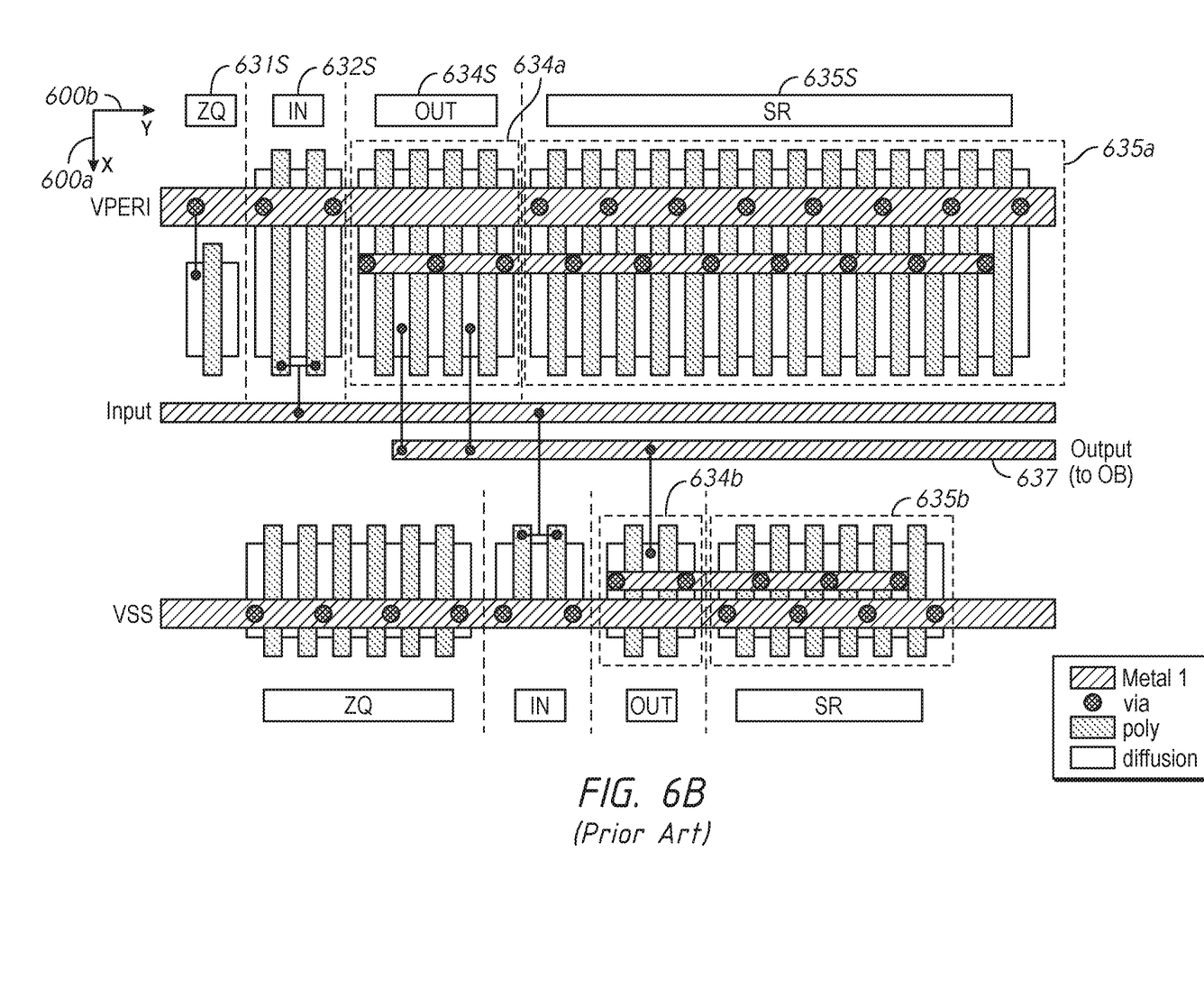
FIG. 6B is a layout diagram of the pre-output driver circuit in the conventional DQ circuit of FIG. 6A.

FIG. 6B is a layout diagram of the pre-output driver circuit in the conventional DQ circuit of FIG. 6A. The peripheral power supply voltage VPERI node and the power supply voltage VSS may node may be provided on a conductive layer (e.g., metal 1 layer). The data signal from the input terminal may be provided to the gate nodes of transistors in the input inverter IN 632 disposed on a poly layer. The drain nodes of the transistors 634a and 634b in the output inverter OUT 634 may be disposed on a diffusion layer. As shown in FIG. 6A, the second channel type transistor 631a and the first channel type transistor 631b for receiving the ZQ control signal ZQ ctrl in a ZQ control stage 631S may be located closer to the input terminal 636 than the input inverter IN 632 in an input stage 632S, the output inverter OUT 634 in an output stage 634S and the plurality of first slew rate control transistors 635a and the plurality of second slew rate control transistors 635b in a slew rate control stage 635S. The plurality of first slew rate control transistors 635a and the plurality of second slew rate control transistors 635b may be located closer to the output terminal 637 than the input inverter IN 632, the output inverter OUT 634, the second channel type transistor 631a and the first channel type transistor 631b. The input inverter IN 632 in the input stage 632S is disposed between the second channel type transistor 631a and the first channel type transistor 631b in the ZQ control stage 631S and the output inverter OUT 634 in the output stage 634S. Thus, as shown in FIGS. 6A and 6B, a wiring on a conductive layer (e.g., metal 1 layer) disposed between the output inverter OUT 634 (such as the second channel type transistor 634a) and the output terminal 637 coupled to the output buffer OB 68 of FIG. 5A (not shown in FIG. 6B) may extend across the slew rate control stage 635S. Thus, the length of the wiring between the output inverter OUT 634a and the output terminal 637 may include the length of the wiring across the plurality of first slew rate control transistors 635a.

Figure 7A:
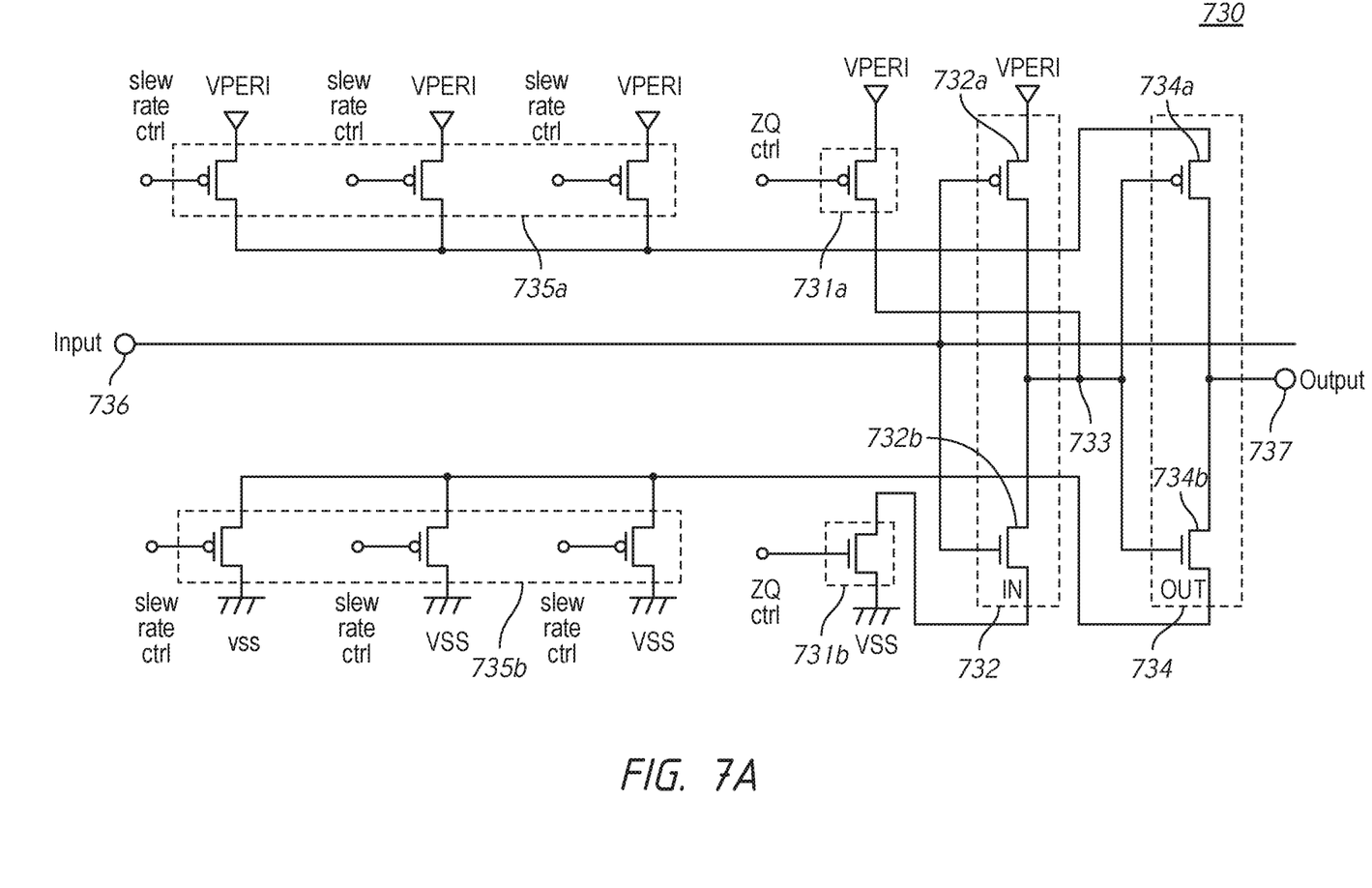
FIG. 7A is a circuit diagram of a pre-output driver circuit in a DQ circuit in accordance with an embodiment of the present disclosure.
Figure 7B:
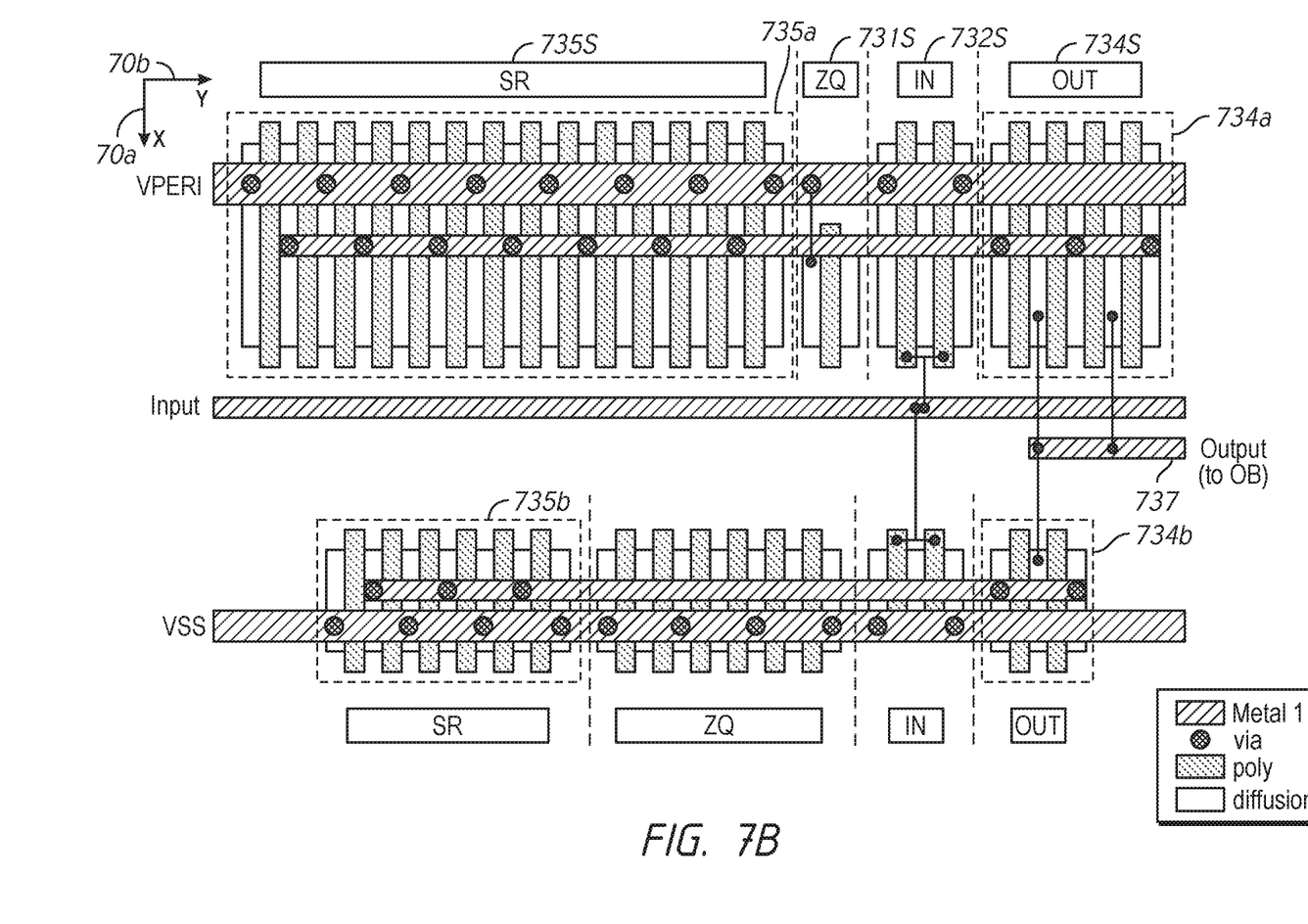
FIG. 7B is a layout diagram of the pre-output driver circuit in the DQ circuit of FIG. 7A in accordance with an embodiment of the present disclosure.

FIG. 7A is a circuit diagram of a pre-output driver circuit 730 in a DQ circuit in accordance with an embodiment of the present disclosure. The pre-output driver circuits 730 may include components similar to the pre-output driver 630P of FIG. 6A, and elements previously described are referenced using common two lowest digits in reference numbers. As such, a detailed description of functionality of components in the driver circuit 730 will not be repeated for FIG. 7A in the interest of brevity. The pre-output driver 730 may include a second channel type transistor 731a and a first channel type transistor 731b. The pre-output driver 730 may include a plurality of first slew rate control transistors 735a and a plurality of second slew rate control transistors 735b. The pre-output driver 730 may include an input inverter IN 732 and an output inverter OUT 734. The input inverter IN 732 may include a second channel type transistor 732a and a first channel type transistor 732b. The output inverter OUT may include a second channel type transistor 734a and a first channel type transistor 734b. The plurality of the first slew rate control transistors 735a, the second channel type transistors 731a, 732a and 734a may be disposed substantially in line in one direction (e.g., Y direction 70b as shown in FIG. 7B, which will be described in detail). The plurality of the second slew rate control transistors 735b, the first channel type transistors 731b, 732b and 734b may be disposed substantially in line in one direction (e.g., Y direction 70b).

FIG. 7B is a layout diagram of the pre-output driver circuit 730 in the DQ circuit of FIG. 7A in accordance with an embodiment of the present disclosure. As shown in FIG. 7A, the plurality of first slew rate control transistors 735a and the plurality of second slew rate control transistors 735b of a slew rate control stage 735S in a slow rate control area may be located closer to an input terminal 736 than the second channel type transistor 731a and the first channel type transistor 731b of a ZQ control stage 731S in a ZQ control area, the input inverter IN 732 of an input stage 732S in an input area and the output inverter OUT 734 of an output stage 734S in an output area, whereas the output inverter OUT 734 is located closer to an output terminal 737 than the plurality of first slew rate control transistors 735a and the plurality of second slew rate control transistors 735b, the second channel type transistor 731a and the first channel type transistor 731b and the input inverter IN 732. The input stage 732S is between the output stage 734S and the slew rate control stage 735S. The ZQ control stage 731S is between the input stage 732S and the slew rate control stage 735S. Thus, as shown in FIGS. 7A and 7B, a wiring on a conductive layer (e.g., metal 1 layer) disposed between the output inverter OUT 734 (such as the second channel type transistor 734a) and the output terminal 737 coupled to the output buffer OB 68 of FIG. 5A (not shown in FIG. 7B) may be outside of the slew rate control area and not include a length across the slew rate control area. Thus, the length of the wiring between the output inverter OUT 734a and the output terminal 737 may be substantially shorter in comparison with the length of the wiring between the output inverter OUT 634a and the output terminal 637.

Figure 8A:
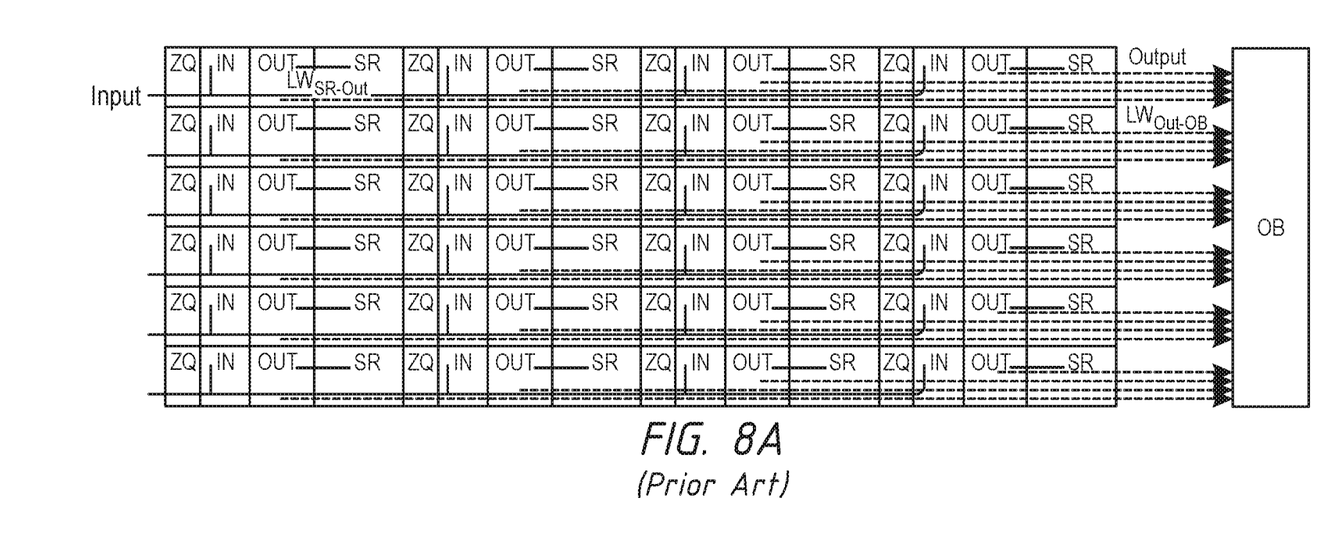
FIG. 8A is a layout diagram of a plurality of pre-output driver circuits in the conventional DQ circuit.
Figure 8B:
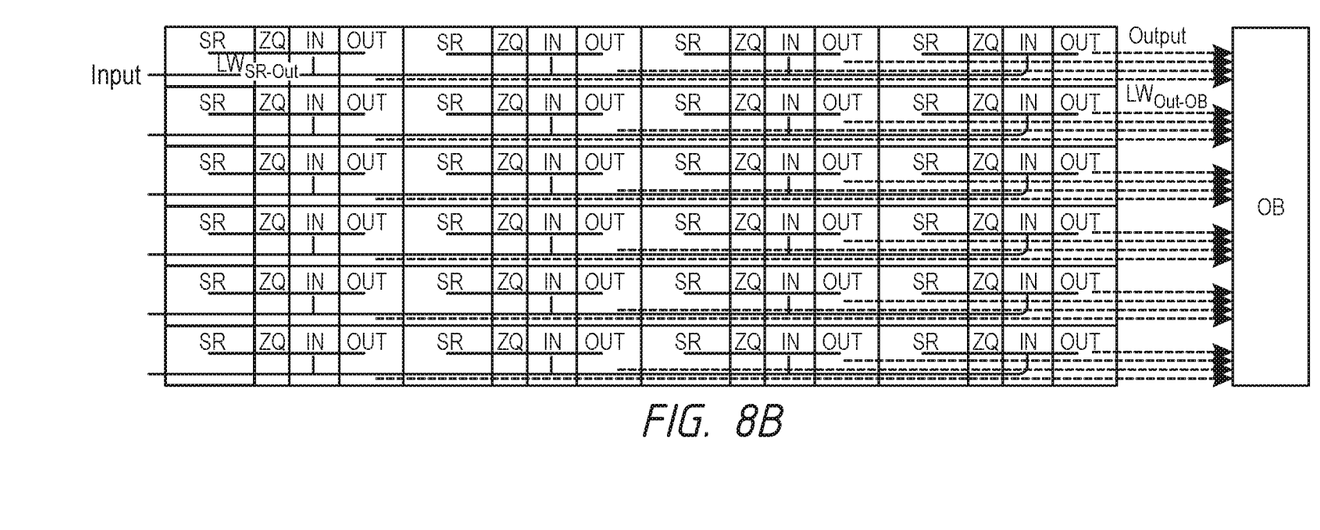
FIG. 8B is a layout diagram of a plurality of pre-output driver circuits in the DQ circuit in accordance with an embodiment of the present disclosure.

FIG. 8A is a layout diagram of a plurality of pre-output driver circuits in the conventional DQ circuit. FIG. 8B is a layout diagram of a plurality of pre-output driver circuits in the DQ circuit in accordance with an embodiment of the present disclosure. An output buffer is coupled to a plurality of pre-output driver. In FIG. 8B, each pre-out driver may include a slew rate control stage, a ZQ control stage, an input stage and an output stage that are aligned in a direction defined by a direction in which the plurality of pre-output drivers are aligned. A wiring length $LW_{SR\text{-}OUT}$ between a plurality of slew rate control transistors and an output inverter OUT in FIG. 8B may be substantially longer than the wiring length $LW_{SR\text{-}OUT}$ in FIG. 8A. A wiring length for providing an input signal may not have a significant change between FIG. 8A and FIG. 8B and a lead-out position in each DQ circuit may change. Thus, a change in an impedance of the wiring for providing the input signal due to the layout change of the DQ circuit between FIG. 8A and FIG. 8B may not be significant. A wiring length $LW_{OUT\text{-}OB}$ between the output inverter OUT and an output buffer OB coupled to the output inverter OUT in FIG. 8B may be substantially shorter than the wiring length $LW_{OUT\text{-}OB}$ in FIG. 8A. Since one DQ circuit may include a number of pre-output driver circuits and one semiconductor device (e.g., a chip) may include a number of DQ circuits, a reduction of the wiring length $LW_{OUT\text{-}OB}$ may cause a significant reduction of current dissipation due to impedance per the chip.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
an output driver; and
a pre-output driver including:
an input stage configured receive a data signal;
an output stage configured to be driven by the input stage to drive the output driver; and
a slew rate control stage configured to control a slew rate of the output stage,
wherein the input stage is disposed between the output stage and the slew rate control stage, and
wherein a layout of the pre-output driver includes the slew rate control stage, the input stage and the output stage aligned in a first direction.

2. The apparatus of claim 1, wherein the input stage includes an input transistor,
wherein the output stage includes an output transistor,
wherein the slew rate control stage includes a plurality of slew rate control transistors, and
wherein the plurality of slew rate control transistors, the input transistor and the output transistor are disposed substantially in line in the first direction.

3. The apparatus of claim 2, further comprising:
a horizontally disposed peripheral power supply voltage conductive layer coupled to the input transistor, the output transistor, and the plurality of slew rate control transistors.

4. The apparatus of claim 2, wherein the output stage is configured to be activated to couple the output terminal to the input stage.

5. The apparatus of claim 1, wherein the pre-output driver further includes a ZQ control stage configured to control activation and deactivation of the pre-output driver, and
wherein the ZQ control stage is disposed between the slew rate control stage and the input stage.

6. The apparatus of claim 5, wherein the input stage includes an input transistor,
wherein the output stage includes an output transistor,
wherein the slew rate control stage includes a plurality of slew rate control transistors,
wherein the ZQ control stage includes a ZQ control transistor, and
wherein the plurality of slew rate control transistors, the ZQ control transistor, the input transistor, and the output transistor are disposed substantially in line in the first direction.

7. An apparatus comprising:
an output driver; and
a pre-output driver that includes:
an input stage including an input transistor;
an output terminal coupled to the output driver, configured to provide an output signal to the output driver;
an output stage configured to receive a data signal and to be driven by the input stage, and further configured to provide the output signal to the output terminal responsive, at least in part, to the data signal, the output stage including an output transistor; and
a slew rate control stage coupled to the output stage and configured to control a current flowing through the output stage, the slew rate control stage including at least one slew rate control transistor,
wherein a layout of the pre-output driver includes the input transistor disposed along a same axis as the output transistor and the at least one slew rate transistor, and
wherein the input transistor is disposed between the at least one slew rate control transistor and the output transistor.

8. The apparatus of claim 7, wherein the pre-output driver further includes an input terminal configured to receive an input signal, and
wherein the input stage is configured to receive the input signal from the input terminal, and further configured to provide the data signal to the output stage responsive to, at least in part to the input signal.

9. The apparatus of claim 7, wherein the input transistor in the input stage is coupled to a power supply voltage.

10. The apparatus of claim 7, wherein the at least one slew rate control transistor in the slew rate control stage includes a plurality of slew rate control transistors coupled to a power supply voltage.

11. The apparatus of claim 7, wherein the pre-output driver further includes a ZQ control stage configured to control activation and deactivation of the pre-output driver.

12. The apparatus of claim 11, wherein the ZQ control stage is disposed between the slew rate control stage and the input stage.

13. The apparatus of claim 12, wherein the pre-output driver is included in a plurality of pre-output drivers,
wherein the output driver is coupled to the plurality of pre-output drivers,
wherein the slew rate control stage, the ZQ control stage, the input stage and the output stage are aligned in the first direction, and
wherein the first direction is defined by a direction in which the plurality of pre-output drivers are aligned.

14. The apparatus of claim 7, wherein the at least one slew rate control transistor in the slew rate control stage includes a plurality of slew rate control transistors.

15. The apparatus of claim 7, wherein the pre-output driver further includes an input inverter and an output inverter.

16. The apparatus of claim 7, wherein the at least one transistor in the slew rate control stage includes a plurality of slew rate control transistors, and
wherein a horizontally disposed peripheral power supply voltage conductive layer is coupled to the input transistor in the input stage, the output transistor in the output stage, and the plurality of slew rate control transistors.

17. An apparatus comprising:
an output driver; and
a pre-output driver that includes:
an input area including an input stage;
an output terminal coupled to the output driver, configured to provide an output signal to the output driver;
a slew rate control area including a slew rate control stage; and
an output area including an output stage coupled between the input stage and the slew rate control stage, the output stage configured to receive a data signal and to be driven by the input stage, and further configured to provide the output signal to the output terminal responsive, at least in part, to the data signal, wherein a layout of the pre-output driver includes the slew rate control area, the input area and the output area aligned in a first direction, and wherein the input area is disposed between the output area of the pre-output driver and the slew rate control area of the pre-output driver.

18. The apparatus of claim 17, wherein the input stage includes an input transistor, the output stage includes an output transistor, and the slew rate control stage includes a plurality of slew rate control transistors.

19. The apparatus of claim 18, wherein the input transistor is disposed between the output transistor and the plurality of slew rate control transistors.

20. The apparatus of claim 17, further comprising:

a horizontally disposed peripheral power supply voltage conductive layer coupled to the input area, the output area, and the slew rate control area.

* * * * *